United States Patent
Kim et al.

(10) Patent No.: US 8,816,257 B2
(45) Date of Patent: Aug. 26, 2014

(54) FLEXIBLE TRANSPARENT HEATING ELEMENT USING GRAPHENE AND METHOD FOR MANUFACTURING THE SAME

(71) Applicant: Graphene Square, Inc., Seoul (KR)

(72) Inventors: Young Jin Kim, Seoul (KR); Byung Hee Hong, Seoul (KR); Jae Boong Choi, Yongin-si (KR); Jonghyun Ahn, Suwon-si (KR); Junmo Kang, Suwon-si (KR); Hyeong Keun Kim, Hwaseong-si (KR); Su Kang Bae, Suwon-si (KR)

(73) Assignee: Graphene Square, Inc., Seoul (KR)

( * ) Notice: Subject to any disclaimer, the term of this patent is extended or adjusted under 35 U.S.C. 154(b) by 0 days.

(21) Appl. No.: 13/946,694

(22) Filed: Jul. 19, 2013

(65) Prior Publication Data

US 2014/0021195 A1    Jan. 23, 2014

Related U.S. Application Data

(63) Continuation of application No. PCT/KR2011/000975, filed on Feb. 14, 2011.

(30) Foreign Application Priority Data

Feb. 12, 2010    (KR) .................. 10-2010-0013305

(51) Int. Cl.
*H05B 3/10*    (2006.01)
*B05D 5/12*    (2006.01)

(52) U.S. Cl.
USPC ............ 219/553; 219/202; 219/528; 427/58; 343/846; 156/60

(58) Field of Classification Search
USPC ................. 219/202–3, 213–4, 218–9, 528–9, 219/552–3; 427/58, 125; 343/700 MS, 846; 156/60, 249

See application file for complete search history.

(56) References Cited

U.S. PATENT DOCUMENTS

| | | | |
|---|---|---|---|
| 2005/0179594 A1* | 8/2005 | Morikawa et al. | 343/700 MS |
| 2009/0056854 A1* | 3/2009 | Oh et al. | 156/60 |
| 2010/0092809 A1* | 4/2010 | Drzal et al. | 429/12 |

FOREIGN PATENT DOCUMENTS

| | | |
|---|---|---|
| KR | 10-2007-0099344 A | 10/2007 |
| KR | 10-2007-0081789 A | 8/2009 |
| KR | 10-2009-0099502 A | 9/2009 |
| KR | 10-2009-0113758 A | 11/2009 |
| KR | 10-2010-0004399 | 1/2010 |

OTHER PUBLICATIONS

International Search Report issued Oct. 13, 2011 in counterpart International Application No. PCT/KR2011/000975, (2 pages in English).

* cited by examiner

*Primary Examiner* — Shawntina Fuqua
(74) *Attorney, Agent, or Firm* — Greer Burns & Crain Ltd.

(57) ABSTRACT

The present invention relates to a flexible transparent heating element using graphene and a method for manufacturing the same. The heating element comprises a flexible transparent substrate; a graphene layer formed to at least one side of the flexible transparent substrate; and an electrode connected with the graphene layer.

22 Claims, 28 Drawing Sheets

FIG. 12
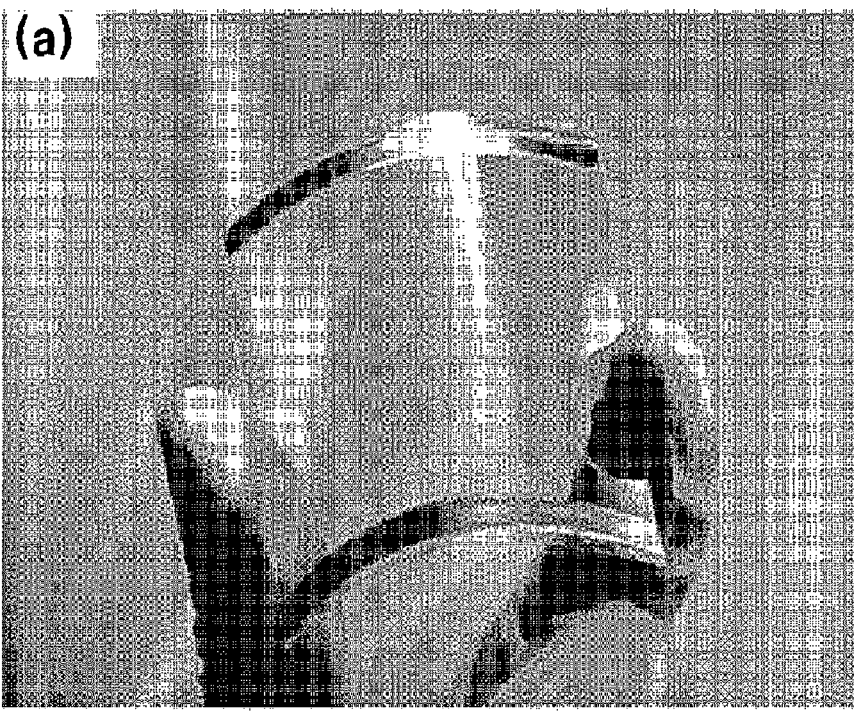
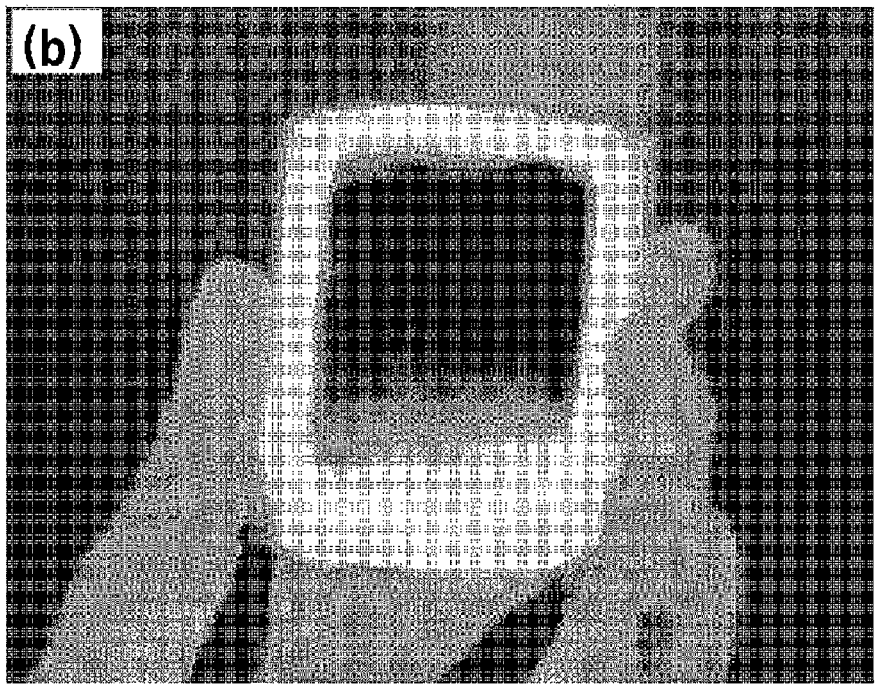

FLEXIBLE TRANSPARENT HEATING ELEMENT USING GRAPHENE AND METHOD FOR MANUFACTURING THE SAME

CROSS-REFERENCE TO RELATED APPLICATIONS

This application is a Continuation of International Application No. PCT/KR2011/000975 filed on Feb. 14, 2011, which claims the benefit of Korean Patent Application No. 10-2010-0013305 filed on Feb. 12, 2010. The entire disclosure of the prior application is incorporated herein by reference in its entirety.

TECHNICAL FIELD

The present invention relates to a flexible transparent heating element using graphene and a method for manufacturing the same, and more particularly relates to a flexible transparent heating element using graphene comprising a graphene layer formed to at least one side of a flexible transparent substrate and a method for manufacturing the same.

BACKGROUND ART

Generally, a heating element converts electricity into heat and transfers the heat to the outside through radiation to transfer energy. Such a heating element has been generally and widely used in various home appliances or various industrial fields.

Heating elements can be roughly classified into metallic heating elements, nonmetallic heating elements, and other heating elements depending on materials thereof. The metallic heating elements including a Fe—Cr—Al-based heating element, a Ni—Cr-based heating element, and a high melting point metal (platinum, Mo, W, Ta, and the like)-based heating element were mainly used in the early days. The nonmetallic heating elements including silicon carbide, molybdenum silicide, lanthanum chromite, carbon, zirconia, and the like have been used thereafter. Further, the other heating elements including a ceramic material, barium carbonate, a thick film resistor, and the like have been used.

The heating elements can be classified into linear heating elements typically called "heating wire" and sheet heating elements depending on outer shapes thereof. By way of example, the linear heating elements include a filament and a nichrome wire. The sheet heating elements generally include heating elements each comprising metallic electrodes provided on both ends of a thin sheet-shaped conductive heating material and insulation-processed with an insulation material and generating heat from all over the surface and may use a metallic thin sheet, heating paint (carbon black), and carbon fiber.

DISCLOSURE OF THE INVENTION

Problems to Be Solved by the Invention

In order to solve the problems, the present invention provides a large-area flexible transparent heating element using graphene with improved heat generation efficiency and a method for manufacturing the same.

However, problems to be solved by the present invention are may not be limited to the above-described problems. Although not described herein, other problems to be solved by the present invention can be clearly understood by those skilled in the art from the following description.

Means for Solving the Problems

In accordance with one aspect of the present invention, there is provided a flexible transparent heating element using graphene, comprising: a flexible transparent substrate; a graphene layer formed to at least one side of the flexible transparent substrate; and an electrode connected with the graphene layer. The graphene layer may generate heat when electrical power is supplied through the electrode, but the present invention may not be limited thereto.

In accordance with an illustrative embodiment, the flexible transparent heating element using graphene may further include, but may not be limited to, a metallic layer between the flexible transparent substrate and the graphene layer. In accordance with an exemplary embodiment, the metallic layer may include, but may not be limited to, at least one metal or alloy selected from the group consisting of Ni, Co, Fe, Pt, Au, Al, Cr, Cu, Mg, Mn, Mo, Rh, Si, Ta, Ti, W, U, V, Zr, brass, bronze, white brass, stainless steel, and Ge.

In accordance with another illustrative embodiment, the electrode may be formed to, but may not be limited to, a terminal of the graphene layer, the top of the graphene layer, or the bottom of the graphene layer. In accordance with an exemplary embodiment, the electrode may be formed to, but may not be limited to, both terminals of the graphene layer, or the top and/or the bottom of the graphene layer. By way of example, if the electrode is formed to the top and/or the bottom of the graphene layer, the electrode may be formed between the flexible transparent substrate and the graphene layer, but the present invention may not be limited thereto.

In accordance with another illustrative embodiment, the electrode may be, but may not be limited to, at least one pair.

In accordance with another illustrative embodiment, the electrode may be, but may not be limited to, a transparent electrode.

In accordance with another illustrative embodiment, the electrode may include, but may not be limited to, ITO, graphene, or carbon nanotube (CNT).

In accordance with another illustrative embodiment, the electrode may be, but may not be limited to, a patterned microstructure. By way of example, the electrode may be a transparent electrode including ITO, graphene, or carbon nanotube (CNT). In particular, if the electrode includes graphene, as described above, a patterned graphene microstructure may be formed to form a graphene electrode and a graphene layer may be transferred thereon, thereby manufacturing the heating element integrated with graphene. However, the present invention may not be limited thereto.

In accordance with still another illustrative embodiment, the flexible transparent substrate may include, but may not be limited to, glass or a polymer. By way of non-limited example, the polymer may include, but may not be limited to, one selected from the group consisting of PET (polyethylene terephthalate), PMMA [poly(methyl methacrylate)], PVDF [poly(vinylidene difluouride)], PANI (polyaniline), and their combinations.

In accordance with still another illustrative embodiment, the graphene layer may include, but may not be limited to, monolayered or multilayered graphene.

In accordance with still another illustrative embodiment, the graphene layer may be, but may not be limited to, doped by using a dopant. In accordance with an exemplary embodiment, the dopant may include, but may not be limited to, organic dopant or inorganic dopant. In accordance with an exemplary embodiment, the dopant may include, but may not be limited to, one selected from the group consisting of ionic fluid, ionic gas, acidic compound, organic molecule compound, and their combinations. In accordance with an exemplary embodiment, the dopant may include, but may not be limited to, one selected from the group consisting of $NO_2BF_4$, $NOBF_4$, $NO_2SbF_6$, HCl, $H_3PO_4$, $H_3CCOOH$, $H_2SO_4$, $HNO_3$, PVDF, Nafion, $AuCl_3$, $SOCl_2$, $Br_2$, $CH_3NO_2$, dichlorodicyanoquinone, oxone, dimyristoylphosphatidylinositol, trifluoromethanesulfonimide, and their combinations.

In accordance with still another illustrative embodiment, the flexible transparent heating element using graphene may further include, but may not be limited to, a protective layer formed to the electrode and the graphene layer. In accordance with an exemplary embodiment, the protective layer may be made of, but may not be limited to, a flexible transparent material.

In accordance with another aspect of the present invention, there is provided a flexible transparent heating element system using graphene formed by serially connecting or parallel connecting plural flexible transparent heating elements using the above-described graphene of the present invention.

In accordance with still another aspect of the present invention, there is provided a method for manufacturing flexible transparent heating element using graphene, comprising: forming a graphene layer to at least one side of a flexible transparent substrate; and forming at least one pair of an electrode connected with the graphene layer.

In accordance with an illustrative embodiment, the method for manufacturing flexible transparent heating element using graphene may further include, but may not be limited to, forming a protective layer to the electrode and the graphene layer.

In accordance with another illustrative embodiment, the electrode may be, but may not be limited to, a patterned microstructure.

In accordance with still another illustrative embodiment, the graphene layer may be formed by, but may not be limited to, transferring a graphene layer, which is prepared by supplying a reaction gas containing a carbon source and heat on a metallic catalyst for reaction, to at least one side of the flexible transparent substrate.

In accordance with still another illustrative embodiment, the method for manufacturing flexible transparent heating element using graphene may further include, but may not be limited to, forming a metallic layer to the flexible transparent substrate before or after the graphene layer is formed to the flexible transparent substrate.

In accordance with still another illustrative embodiment, the electrode may be formed to, but may not be limited to, a terminal of the graphene layer, the top of the graphene layer, or the bottom of the graphene layer. In accordance with an exemplary embodiment, the electrode may be formed to, but may not be limited to, both terminals of the graphene layer, or the top and/or the bottom of the graphene layer.

In accordance with still another illustrative embodiment, the graphene layer may include, but may not be limited to, monolayered or multilayered graphene.

In accordance with still another illustrative embodiment, the electrode may be, but may not be limited to, a transparent electrode.

In accordance with still another illustrative embodiment, the electrode may include, but may not be limited to, ITO, graphene, or carbon nanotube (CNT).

All the above descriptions about the flexible transparent heating element can be applied to the flexible transparent heating element system using graphene and the method for manufacturing a flexible transparent heating element using graphene in accordance with the present invention, and redundant descriptions will be omitted for convenience sake.

Effect of the Invention

In accordance with the present invention, a flexible transparent heating element is prepared by using graphene instead of metallic materials or nonmetallic materials conventionally used as a heating element, so that it is possible to provide a flexible transparent heating element with improved electrical and mechanical characteristics. Further, in the flexible transparent heating element using graphene in accordance with the present invention, the graphene is improved in chemical, physical, and structural characteristics, so that heat generation efficiency and heat radiation efficiency can be increased. Further, transparency of the heating element is adjusted by varying the number of graphene layers. Therefore, it is possible to provide a flexible transparent heating element.

BRIEF DESCRIPTION OF THE DRAWINGS

FIG. 12 provides a photo and a thermal image of a large-area graphene film prepared in accordance with an example of the present invention.

BEST MODE FOR CARRYING OUT THE INVENTION

Figure 1:
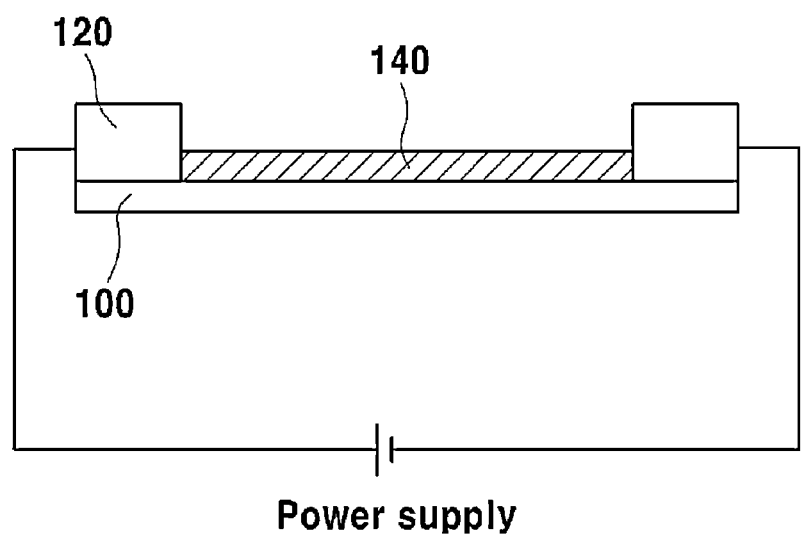
FIG. 1 is a cross sectional view of a flexible transparent heating element using graphene in accordance with an illustrative embodiment of the present invention.

Hereinafter, illustrative embodiments and examples of the present invention will be described in detail with reference to the accompanying drawings so that the present invention may be readily implemented by those skilled in the art.

However, it is to be noted that the present invention is may not be limited to the illustrative embodiments and examples but can be embodied in various other ways. In drawings, parts irrelevant to the description are omitted for the simplicity of explanation, and like reference numerals denote like parts through the whole document.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

The term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

FIGS. 1 to 6 are cross sectional views of flexible transparent heating elements using graphene prepared in accordance with various illustrative embodiments of the present invention.

Figure 4:
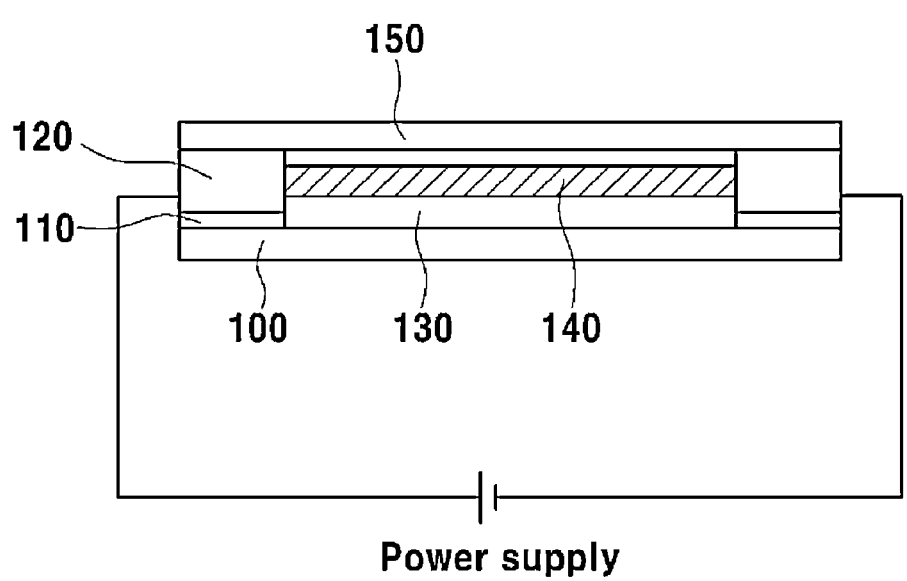
FIG. 4 is a cross sectional view of a flexible transparent heating element using graphene further comprising a protective layer in accordance with an illustrative embodiment of the present invention.
Figure 5:
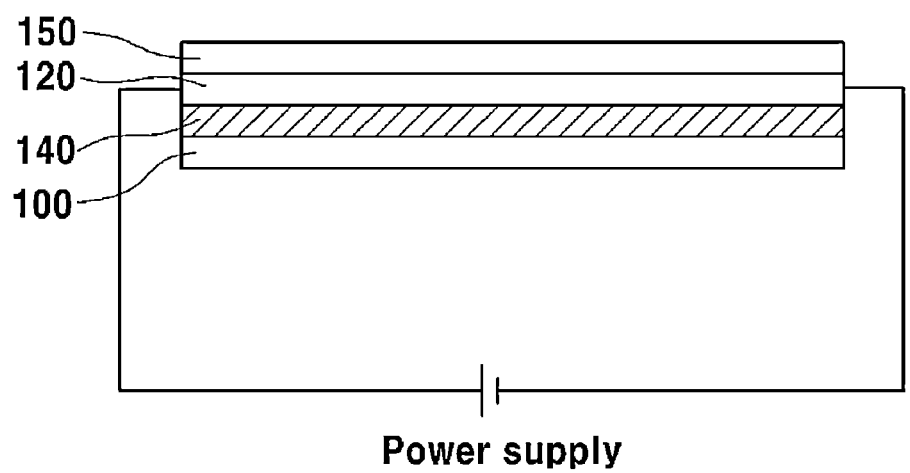
FIG. 5 is a cross sectional view of a flexible transparent heating element using graphene in which a transparent electrode is formed on the entire surface of a graphene layer in accordance with an illustrative embodiment of the present invention.
Figure 6:
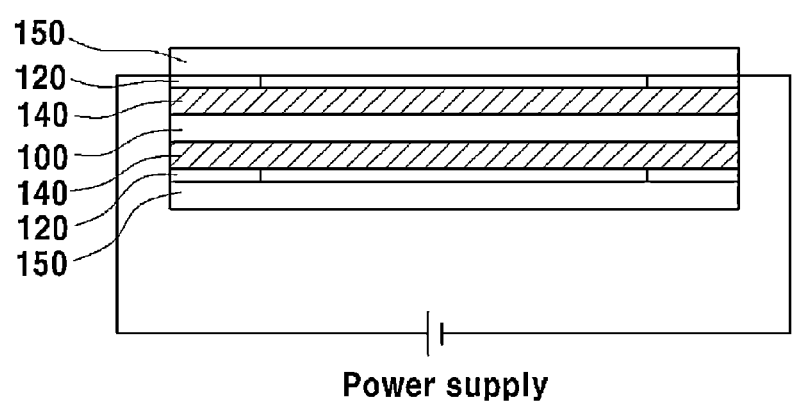
FIG. 6 is a cross sectional view of a flexible transparent heating element using graphene in which a graphene layer is formed on both surfaces of a flexible transparent substrate in accordance with an illustrative embodiment of the present invention.
Figure 7:
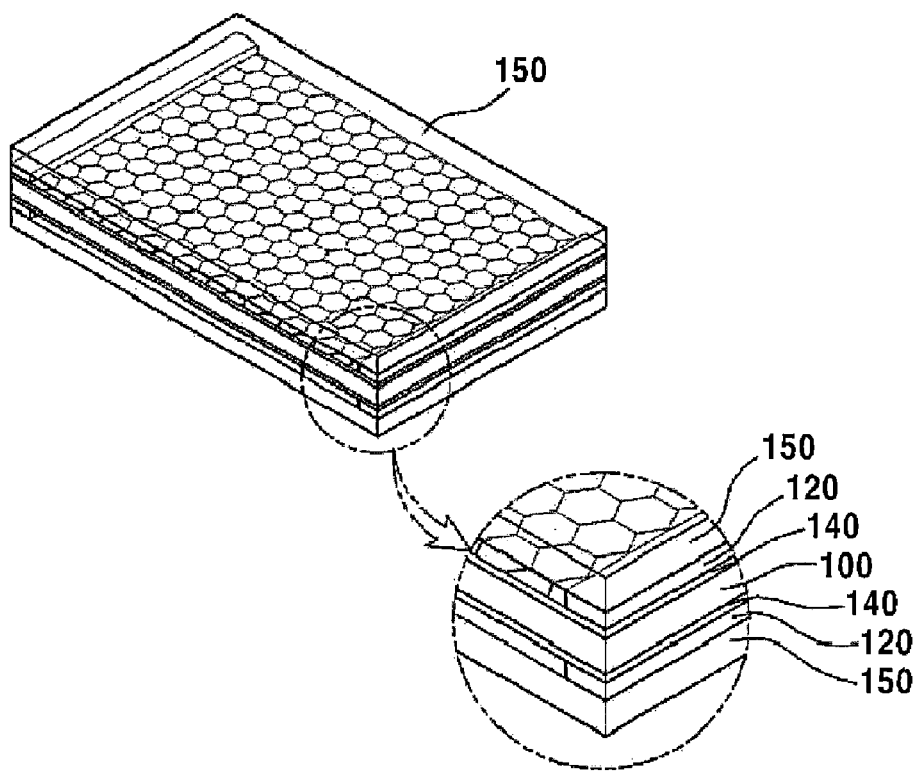
FIG. 7 is a perspective view of a flexible transparent heating element using graphene in which a graphene layer is formed on both surfaces of a flexible transparent substrate in accordance with an example of the present invention.

To be specific, referring to FIG. 1, a flexible transparent heating element using graphene in accordance with an illustrative embodiment comprises a flexible transparent substrate 100; a graphene layer 140 formed to at least one side of the flexible transparent substrate; and an electrode 120 connected with the graphene layer. If the graphene layer is formed to at least one side of the flexible transparent substrate, a position of the graphene layer is not limited specifically. By way of example, the graphene layer may be formed on a part of an upper surface of the flexible transparent substrate and the electrode may be formed on the other parts of the flexible transparent substrate as depicted in FIGS. 1 to 4, but the present invention may not be limited thereto. Further, by way of example, as depicted in FIG. 5, the graphene layer may be positioned on, but may not be limited to, the entire upper surface of the flexible transparent substrate. Further, in order to increase heat efficiency of the heating element, the graphene layer may be formed on both of the upper surface and a lower surface of the flexible transparent substrate. In this case, heat radiated from graphene is generated from the front and rear surfaces at the same time. Thus, heat per unit area can be increased.

Figure 2:
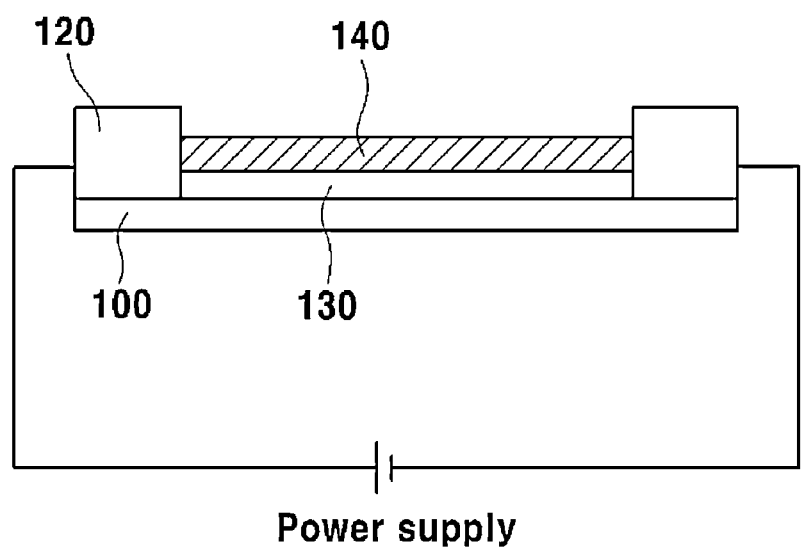
FIG. 2 is a cross sectional view of a flexible transparent heating element using graphene further comprising a metallic layer in accordance with an illustrative embodiment of the present invention.
Figure 3:
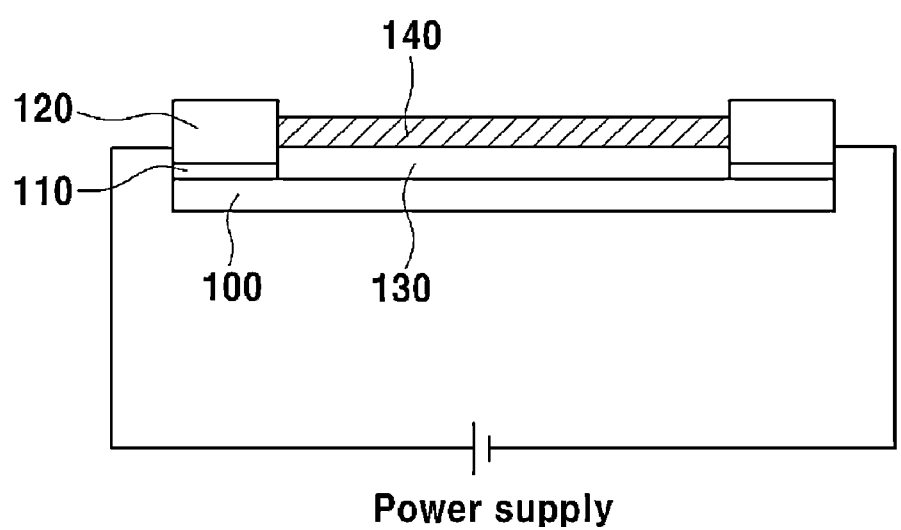
FIG. 3 is a cross sectional view of a flexible transparent heating element using graphene further comprising a metallic paste layer in accordance with an illustrative embodiment of the present invention.

As depicted in FIG. 2, a metallic layer 130 may be further formed on the flexible transparent substrate 100. The metallic layer 130 may be formed on a partial surface or the entire surface of the flexible transparent substrate 100. Even if a small number of graphene layers are transferred to the flexible transparent substrate, the metallic layer allows an electric current to easily flow between the both electrodes 120. Thus, heat generation efficiency and heat radiation efficiency can be improved, and a surface area can be increased and a surface resistance (or a sheet resistance) can be decrease. Therefore, higher-temperature heat can be generated and the generated heat can be radiated more rapidly. Further, a natural tinting effect can be expected depending on a kind of coating metal. Therefore, if applied to a product, the flexible transparent heating element may have an aesthetic effect with appropriate transparency.

The metallic layer 130 may include, but may not be limited to, at least one metal or alloy selected from the group consisting of Ni, Co, Fe, Pt, Au, Al, Cr, Cu, Mg, Mn, Mo, Rh, Si, Ta, Ti, W, U, V, Zr, brass, bronze, white brass, stainless steel, and Ge.

If the metallic layer is formed on the flexible transparent substrate, the metallic layer may serve as a catalyst for forming the graphene. Since the graphene layer is formed directly by supplying a reaction gas containing a carbon source and heat onto the flexible transparent substrate on which the metallic layer is formed, the heating element can be manufactured without an additional transfer process.

If the electrode 120 is connected with the graphene layer, its position is not limited. By way of example, the electrode may be formed on at least one surface of the flexible transparent substrate 100 or may be formed on both terminals of the graphene layer or the top and/or the bottom of the graphene layer. By way of example, the electrode may be formed to, but may not be limited to, both terminals of the graphene as depicted in FIGS. 1 to 4 or the top of the graphene layer as depicted in FIG. 5. In this case, desirably, a transparent electrode may be used as the electrode in order to obtain transparency of the heating element. Further, if necessary, a metal paste layer 110, for example, an Ag paste layer, may be formed on the flexible transparent substrate 100 and the electrode may be bonded to the metal paste layer as depicted in FIG. 4, so that the electrode can be positioned easily.

A material of the electrode is not specifically limited if it is typically used in the art. By way of example, the electrode may include, but may not be limited to, ITO, graphene, or carbon nanotube (CNT). If the electrode includes graphene, as described below, a patterned graphene microstructure may be formed to form a graphene electrode and a graphene layer may be transferred thereon, thereby manufacturing the heating element integrated with graphene. However, the present invention may not be limited thereto.

Figure 8:
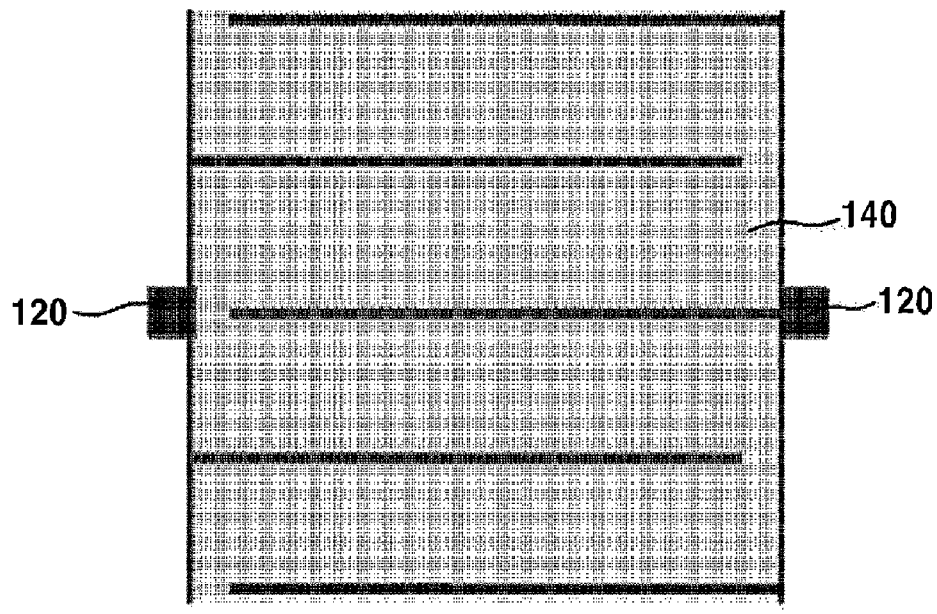
FIG. 8 is a schematic view of a flexible transparent heating element comprising an electrode formed into a patterned microstructure in accordance with an illustrative embodiment of the present invention.

If the flexible transparent heating element in accordance with an illustrative embodiment of the present invention is formed to have a large area, desirably, a transparent electrode formed into a patterned microstructure may be formed on the graphene layer as depicted in FIG. 8 instead of forming the electrode to both terminals of the flexible transparent substrate in order to uniformly generate heat from the entire surface of the heating element with high efficiency. By way of non-limited example, the transparent electrode may be formed into a patterned microstructure on the top and/or the bottom of the graphene layer and may be formed by serially connecting or parallel connecting plural electrodes. In this case, an amount of heat can be increased.

Figure 9A:
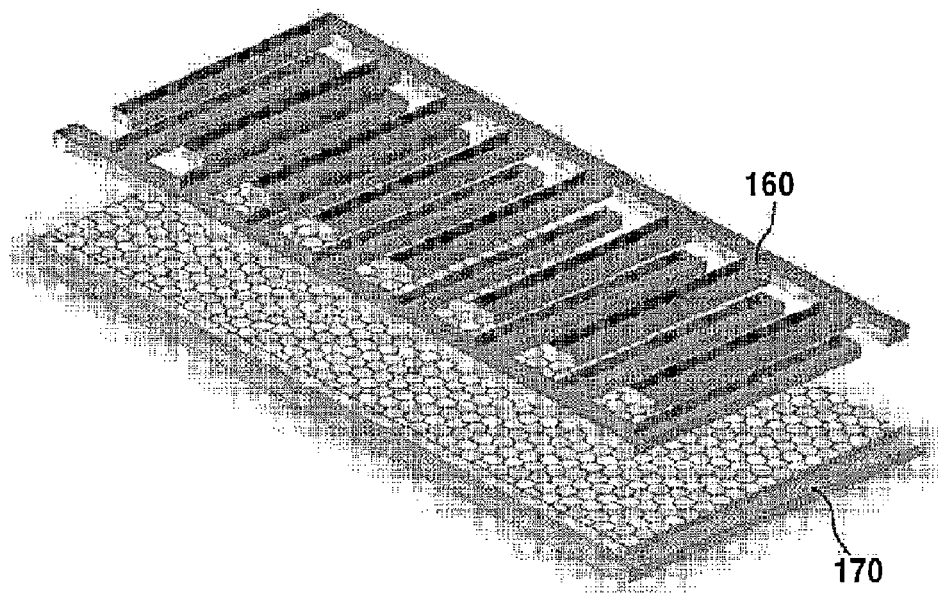
FIGS. 9A-9D are schematic views for explaining a process for forming an electrode into a patterned microstructure in accordance with an illustrative embodiment of the present invention.
Figure 9B:
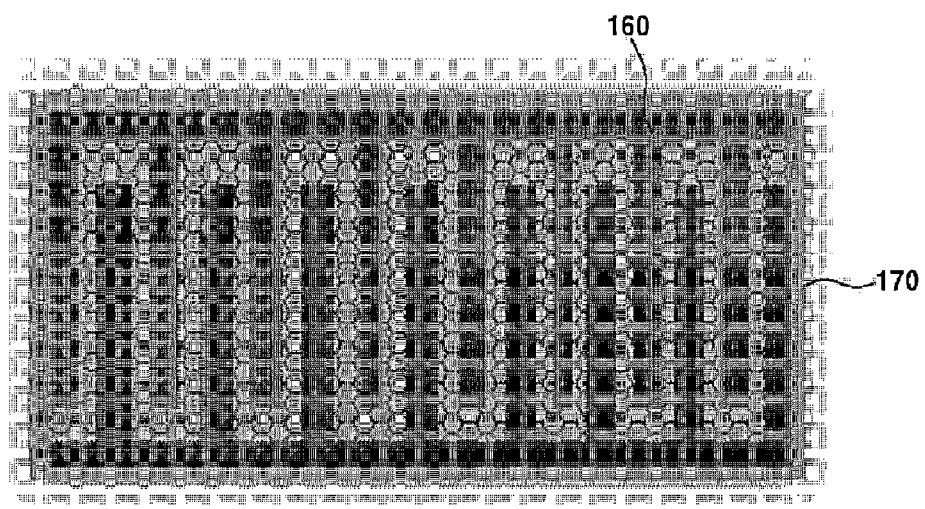
Figure 9C:
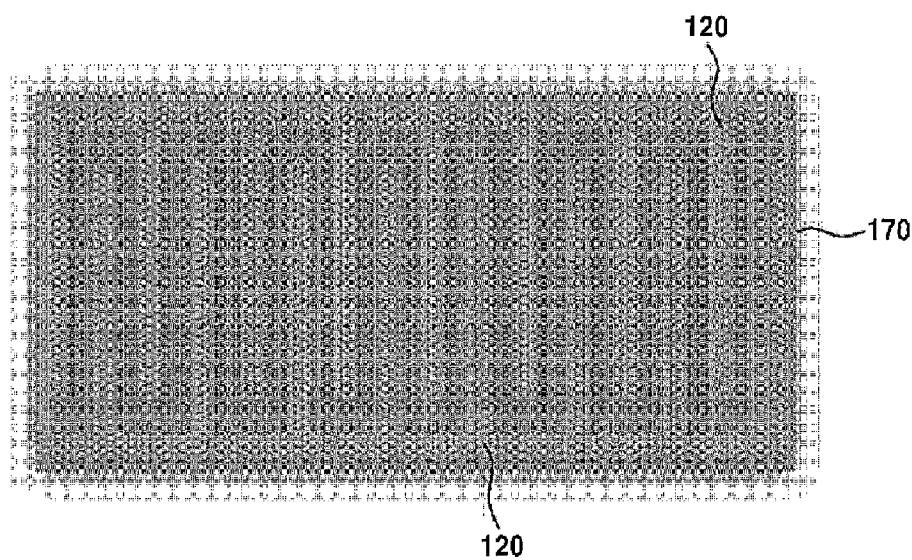
Figure 9D:
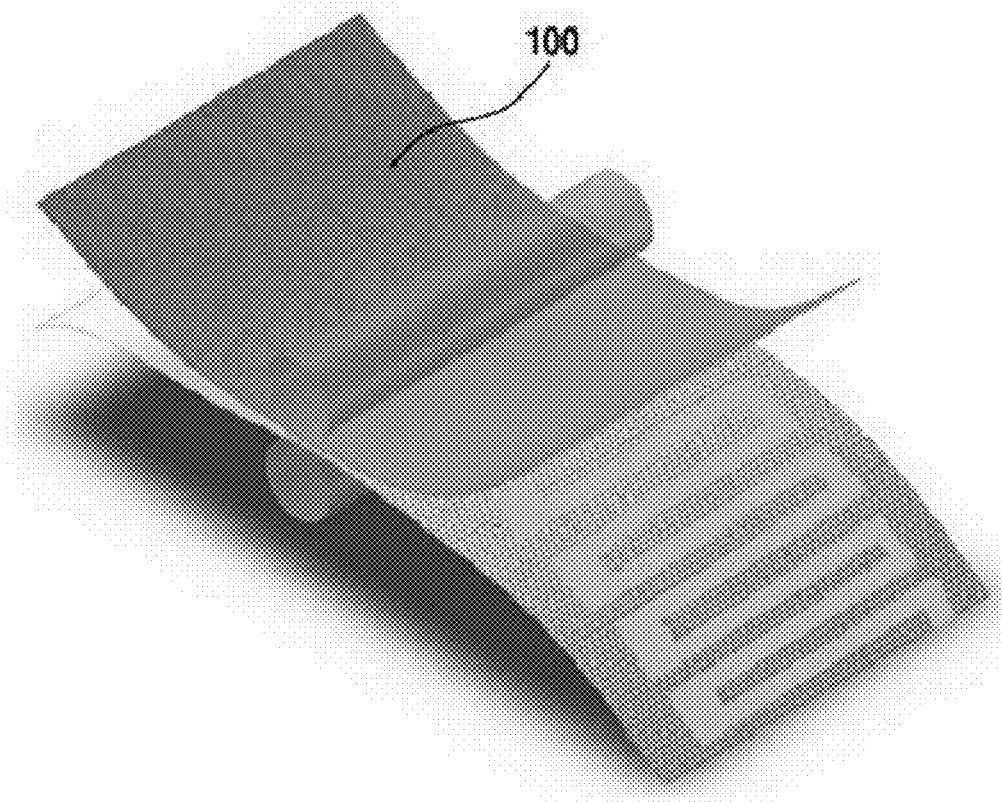

The heating element including the transparent electrode formed into a patterned microstructure may be formed by forming a transparent electrode to have a micro pattern through a mask process and then forming a graphene layer serving as a heating layer on the micro-patterned electrode, or by forming a graphene layer serving as a heating layer on at least one side of the flexible transparent substrate 100 and then forming a micro-patterned graphene film serving as a transparent electrode on the graphene layer. In an illustrative embodiment, if the electrode is a transparent electrode including graphene, forming the micro-patterned electrode on the flexible transparent substrate 100 includes transferring a graphene layer onto a flexible substrate 170, forming the graphene layer into a patterned microstructure by using a mask, and then transferring the graphene layer of one layer or multiple layers onto the substrate by means of a roll-to-roll process. To be more specific, a graphene layer may be formed on the flexible substrate 170 (FIG. 9A), a shadow mask 160 may be positioned on the flexible substrate (FIG. 9B), and the graphene layer may be formed into a patterned microstructure through an etching process (for example, by using normal-pressure $O_2$ plasma) (FIG. 9C). Then, the flexible substrate may be transferred onto a target substrate, for example, the flexible transparent substrate 100, through a roll-to-roll process (FIG. 9D). Herein, the flexible substrate 170 may include, but may not be limited to, a polymer, for example, a thermal release polymer.

A protective layer may be formed on the electrode 120 and the graphene layer 140. The protective layer may be made of a flexible transparent material, for example, a transparent polymer material such as PET. The protective layer is configured to protect the graphene layer 140 under the protective layer and allow heat generated from the surface of the graphene layer 140 to be uniformly radiated therearound instead of being directly radiated.

Figure 10:
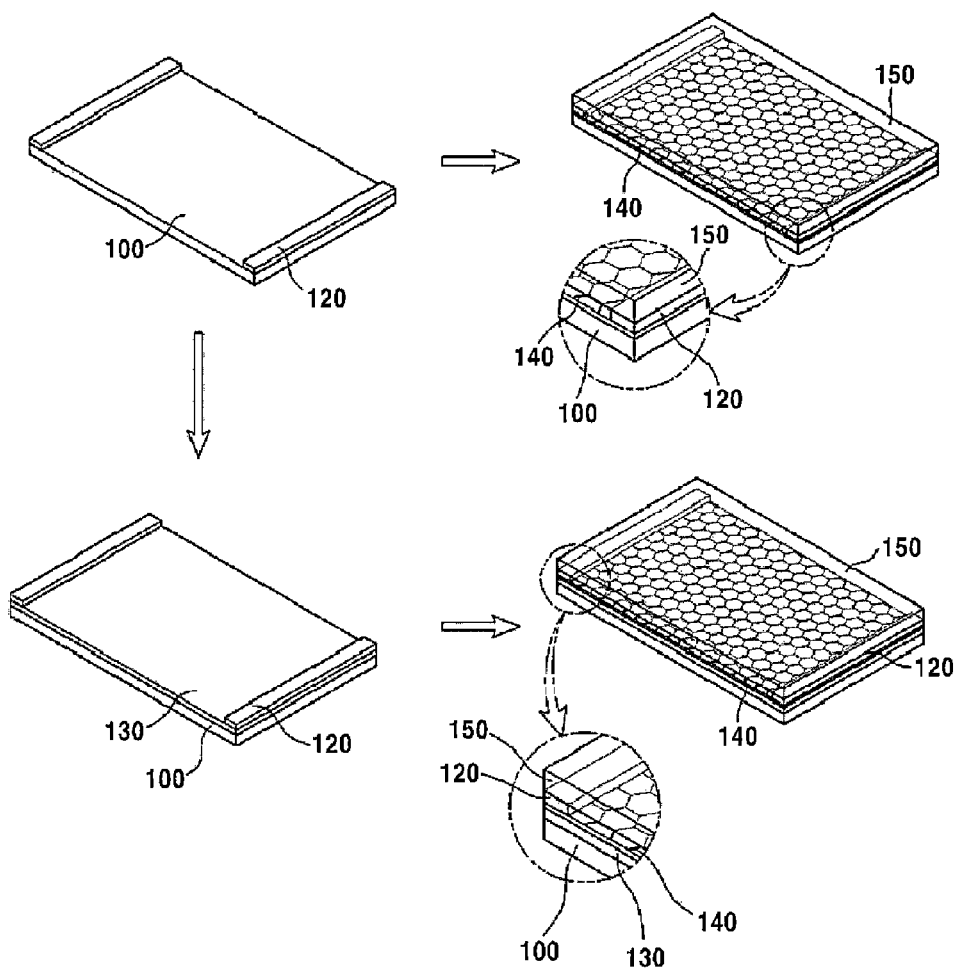
FIG. 10 is a schematic view for explaining a process for manufacturing a flexible transparent heating element using graphene in accordance with an illustrative embodiment of the present invention.

FIG. 10 is a schematic view for explaining a process for manufacturing a flexible transparent heating element using graphene in accordance with an illustrative embodiment of the present invention.

First of all, the flexible transparent substrate 100 is prepared and then the graphene layer 140 is formed on at least one side of the flexible transparent substrate. In order to form the graphene layer on the flexible transparent substrate, a graphene layer formed on another substrate may be transferred onto the flexible transparent substrate, or if a metallic layer is formed on the flexible transparent substrate as described above, a graphene layer may be formed directly on the metallic layer on the flexible transparent substrate.

By way of example, the graphene layer 140 may be formed by transferring a graphene layer, which is prepared by supplying a reaction gas containing a carbon source and heat on a metallic catalyst for reaction, to at least one side of the flexible transparent substrate. The carbon source such as carbon monoxide, carbon dioxide, methane, ethane, ethylene, ethanol, acetylene, propane, butane, butadiene, pentane, pentene, cyclopentadiene, hexane, cyclohexane, benzene, and toluene may be supplied in the form of gas while being heat-treated at, for example, about 300° C. to about 2000° C. Then, carbon elements of the carbon source are bonded to each other so as to form a hexagonal plate structure. Thus, a graphene layer is grown. The metallic catalyst layer is formed to help a graphene film easily grow on the substrate, and the metallic catalyst layer is not specifically limited in material. By way of example, the metallic catalyst layer may include at least one metal or alloy selected from the group consisting of Ni, Co, Fe, Pt, Au, Al, Cr, Cu, Mg, Mn, Mo, Rh, Si, Ta, Ti, W, U, V, Zr, brass, bronze, white brass, stainless steel, and Ge. Further, the metallic catalyst layer is not specifically limited in thickness and may be a thin film or a thick film. A method for forming the graphene layer can be employed from methods typically used in the art for growing graphene without specific limitation. By way of example, a chemical vapor deposition method may be used, but the present invention may not be limited thereto. The chemical vapor deposition method may include, but may not be limited to, rapid thermal chemical vapor deposition (RTCVD), inductively coupled plasma-chemical vapor deposition (ICP-CVD), low pressure chemical vapor deposition (LPCVD), atmospheric pressure chemical vapor deposition (APCVD), metal organic chemical vapor deposition (MOCVD), and plasma-enhanced chemical vapor deposition (PECVD).

A process for growing the graphene layer can be performed under a normal pressure, a low pressure or vacuum. By way of example, if the process is performed under the condition of a normal pressure, helium (He) or the like may be used as a carrier gas, and, thus, it is possible to minimize damage to graphene caused by collision with heavy argon (Ar) at a high temperature. Further, if the process is performed under the condition of a normal pressure, a large-area graphene film can be produced through a simple process at low costs. If the process is performed under the condition of a low pressure or vacuum, hydrogen ($H_2$) may be used as an atmosphere gas while increasing a temperature during the process, so that an oxidized surface of a metal catalyst is reduced and high-quality graphene can be synthesized. A graphene layer formed by the above-described method may have a large area with a horizontal and/or vertical length of from about 1 mm to about 1000 m. The graphene film may have a homogeneous structure with little deficits. The graphene layer formed by the above-described method may include monolayered or multi-layered graphene. By way of non-limited example, a thickness of the graphene film can be adjusted in a range of from 1 layer to 100 layers.

Then, the graphene layer 140 may be transferred onto the flexible transparent substrate by various methods. A transfer method can be employed from methods typically used in the art for transferring a graphene layer onto a substrate to be coated without specific limitation. By way of example, a dry process, a wet process, a spray process, or a roll-to-roll process may be used.

The roll-to-roll process may be used to transfer a large-area graphene layer. By way of example, a large-area graphene layer may be transferred onto the flexible substrate by the roll-to-roll process in order to form a graphene layer as a heating plate. Further, if the electrode is a transparent electrode including graphene, a graphene layer can be transferred onto the flexible transparent substrate by the roll-to-roll process and a micro pattern can be readily formed on the graphene electrode.

Figure 11:
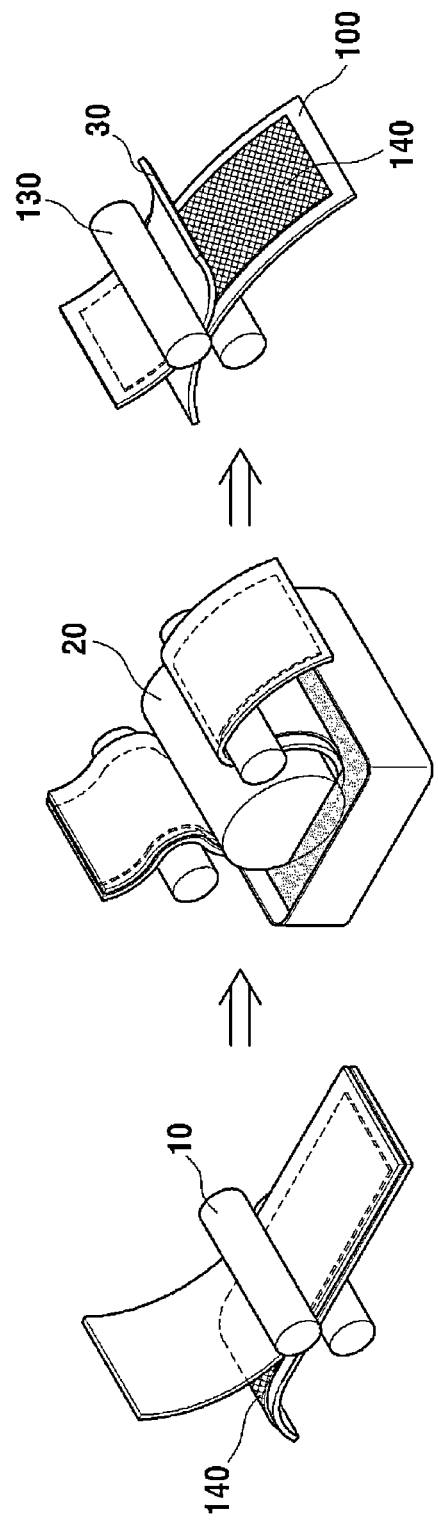
FIG. 11 is a schematic view illustrating a process for transferring a large-area graphene film to a target substrate and a transfer apparatus related thereto in accordance with an illustrative embodiment of the present invention.

The transfer method using the roll-to-roll process in accordance with an illustrative embodiment includes rolling the flexible substrate on which a graphene film is formed and the target substrate in contact with the graphene with a transfer roller and transferring the graphene film onto the target substrate (see FIG. 11). To be more specific, the transfer method may include three steps. The three steps are comprised of rolling a graphene film formed on a graphene growth supporter and a flexible substrate in contact with the graphene by using a first roller 10, which is an adhesion roller, to form a layered structure of graphene growth supporter-graphene film-flexible substrate; immersing the layered structure into an etching solution and passing the layered structure through the etching solution by using a second roller 20 to etch the graphene growth supporter and transfer the graphene film onto the flexible substrate; and rolling the flexible substrate, on which the graphene film is transferred, and a target substrate in contact with the graphene film by using a third roller 30, which is a transfer roller, to transfer the graphene film onto the target substrate.

Finally, after the graphene layer 140 is transferred onto the flexible transparent substrate 100, the electrode 120 may be formed to both terminals of the graphene layer 140 or the top and/or the bottom of the graphene layer 140.

FIG. 12 provides a photo (FIG. 12a) and a thermal image (FIG. 12b) of a flexible transparent heating element using graphene prepared in accordance with an example of the present invention. To be more specific, in the flexible transparent heating element, a graphene layer was formed by transferring graphene onto a PET layer and a copper electrode was provided at both terminals of the graphene layer to apply a voltage and a current. Herein, the copper electrode was deposited with a thickness of about 100 nm at a deposition rate of about 1 Å/sec by using a thermal evaporator and both terminals of the copper electrode were exposed by using a shadow mask. In order to prevent generated heat from directly escaping to the atmosphere, the PET layer as a protective layer was formed on the graphene layer and the top of the electrode and fixed with an insulation tape. Then, all sides of the heating element were protected from the outside by using a clip. It can be seen that the flexible transparent heating element manufactured by the above-described method had a high transmittance of about 88.5%. As can be seen from the photo, the graphene was not broken or deformed despite a bending load applied thereto. It can be seen that even if the heating element was operated while a bending load was applied thereto, a heat generation characteristic was not changed or a surface thereof was not damaged. In the example of the present invention, a transmittance with respect to a surface was measured by using a UV-Vis-NIR spectrum and changes in temperature on a graphene surface were measured and analyzed by using a thermal image camera.

FIGS. 13A-13C and 14A-14C show a result of a comparison of thermal images, graphs of thermal distribution curves, and thermal distribution indexes on surfaces of flexible transparent heating elements respectively using five-layer graphene and six-layer graphene in accordance with an example of the present invention.

Figure 13A:
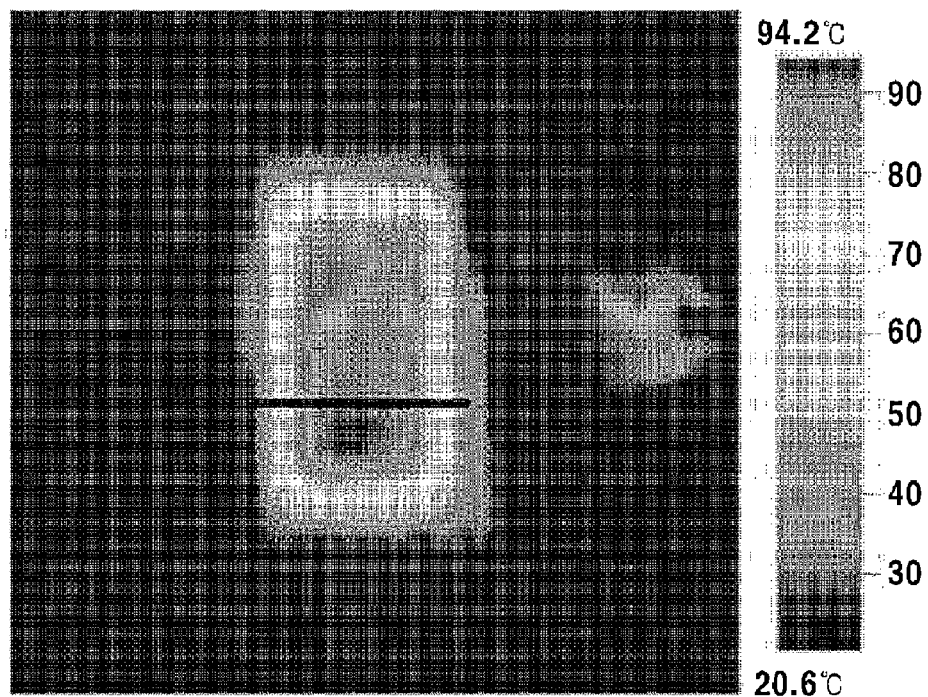
FIGS. 13A-13C provide a thermal image (FIG. 13A), graphs of a thermal distribution curve (FIG. 13B) and a thermal distribution index (FIG. 13C) on a surface of a flexible transparent heating element using five-layer graphene in accordance with an example of the present invention.
Figure 13B:
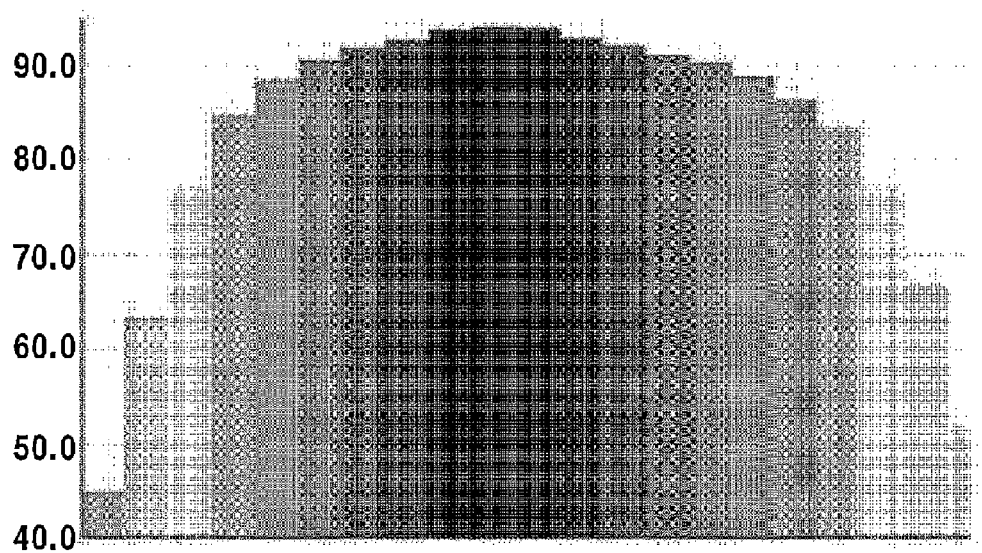
Figure 13C:
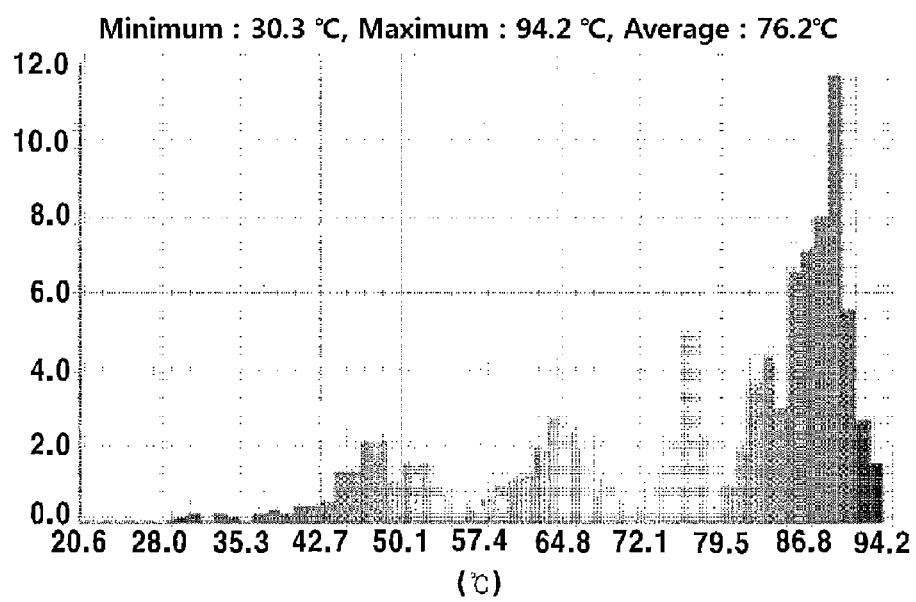

To be more specific, FIG. 13A shows a result of an experiment where a flexible transparent heating element, in which five-layer graphene was transferred and deposited onto a surface of a flexible transparent PET substrate, was analyzed by a thermal image camera in accordance with an example of the present invention. In the experiment, a voltage of about 20 V and a current of about 2.5 A were applied to both electrodes 120 of the flexible transparent heating element and power consumed was about 5 W. A temperature scale bar on the right of FIG. 13A shows color changes to represent a temperature distribution in a range from minimum about 20.6° C. to maximum about 94.2° C. Referring to this temperature scale bar, it could be seen that a graphene surface of about 4×8 $cm^2$ between the both electrodes 120 uniformly generate heat. FIG. 13B provides a thermal distribution curve around a point where the highest-temperature heat was generated on the graphene surface. It could be seen that heat generated from the graphene surface had an average temperature of about 82.8°C., and a temperature of heat was highest at a central point and decreased gradually toward the sides. However, there was no steep temperature gradient, and, thus, it could be seen that heat was generated uniformly from the graphene surface. FIG. 13C provides a graph showing a thermal distribution index on the graphene surface. High thermal distribution indexes could be seen from about 80° C. to about 94° C.

Figure 14A:
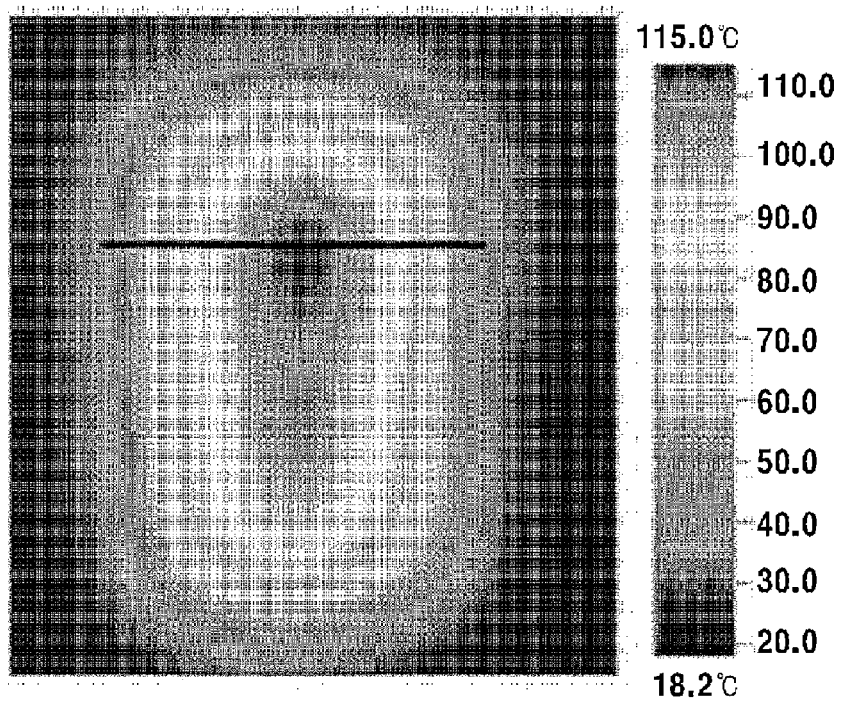
FIGS. 14A-14C provide a thermal image (FIG. 14A), graphs of a thermal distribution curve (FIG. 14B), and a thermal distribution index (FIG. 14C) on a surface of a flexible transparent heating element using doped six-layer graphene in accordance with another example of the present invention.
Figure 14B:
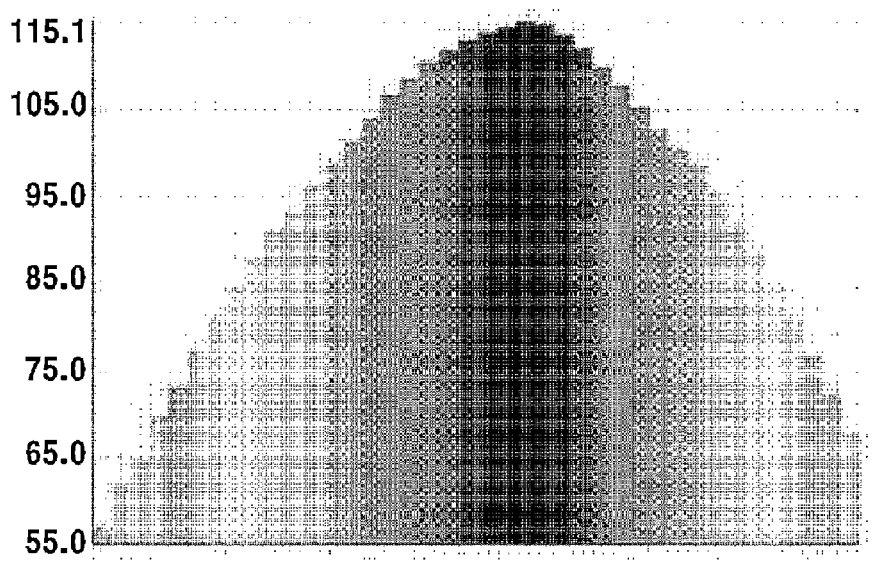
Figure 14C:
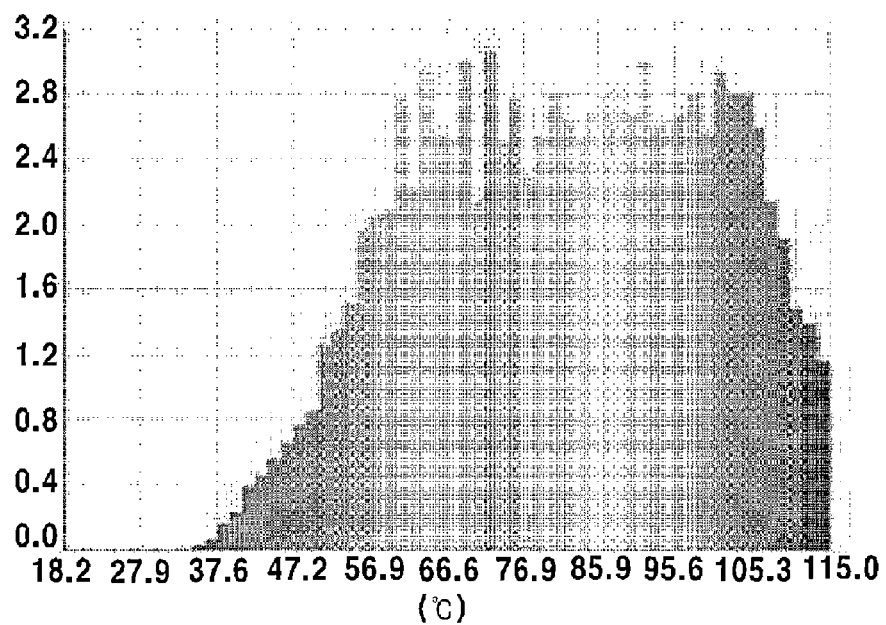

FIG. 14A provides a result of analysis of a flexible transparent heating element using six-layer graphene doped with a dopant such as $HNO_3$ to reduce a surface resistance by a thermal image camera. In the experiment, a voltage of about 20 V and a current of about 2.5 A were applied to both electrodes 120 and power consumed was about 8 W. As compared with FIG. 13A, it could be seen that a temperature distribution was concentrated above a central point. However, the highest temperature was about 115° C. and the lowest temperature was about 18.2° C. and an average temperature was about 94° C. FIG. 14B provides a thermal distribution curve around a point where the highest-temperature heat was generated on the graphene surface. As compared with FIG. 13B, it could be seen that there was a steeper temperature gradient. However, the average temperature was about 94° C. which was higher than that of the five-layer graphene. Thus, it could be seen that heat was not partially generated but heat of a high average temperature was generated and particularly, high-temperature heat was generated at a central area. FIG. 14C provides a graph showing a thermal distribution index on a surface of doped six-layer graphene. As compared with FIG. 13C, heat was distributed uniformly and an overall temperature was higher by about 12° C.

Heat efficiency of the flexible transparent heating element in accordance with the present invention can be increased by improving chemical, physical, and structural characteristics.

As a chemical method for increasing heat efficiency of the flexible transparent heating element, doped graphene is used to increase heat generation efficiency of the flexible transparent heating element.

Figure 15:
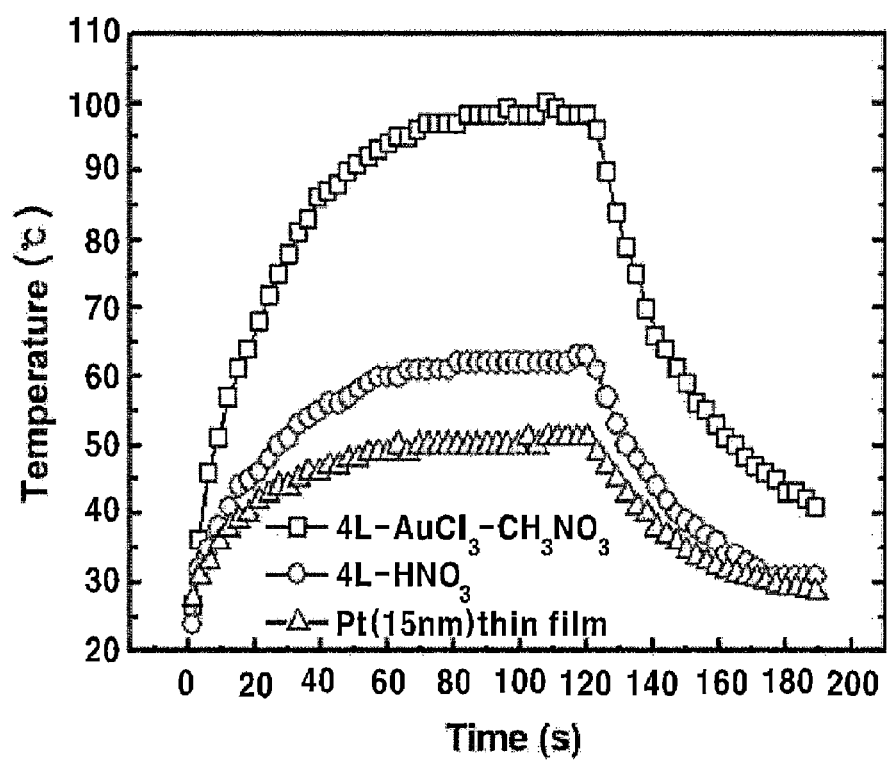
FIG. 15 provides a graph showing changes in temperature over time of flexible transparent heating elements using graphene doped with various dopants in accordance with an example of the present invention.

FIG. 15 provides a graph showing changes in temperature over time of flexible transparent heating elements using graphene doped with various dopants in accordance with an example of the present invention. All samples were prepared with the same size of about 40×40 $mm^2$ and the three samples were comprised of a metal thin film coated with Pt having a thickness of about 15 nm as a reference sample, four-layer graphene doped with $AuCl_3$—$CH_3NO_2$, and four-layer graphene doped with $HNO_3$. An operation was performed under the input condition of about 12 V, and the metal thin film was operated by about 20 V. Each of the samples reached a temperature close to its own highest temperature within about 1 minute with a high reaction rate, and particularly, a surface temperature of the graphene doped with $AuCl_3$—$CH_3NO_2$ was increased to about 100° C. within about 1 minute. Therefore, it could be seen that with the same number of graphene layers, there was a great difference in a surface temperature, at which a reaction was made under the same input condition, depending on surface resistance improved by doping.

Figure 16:
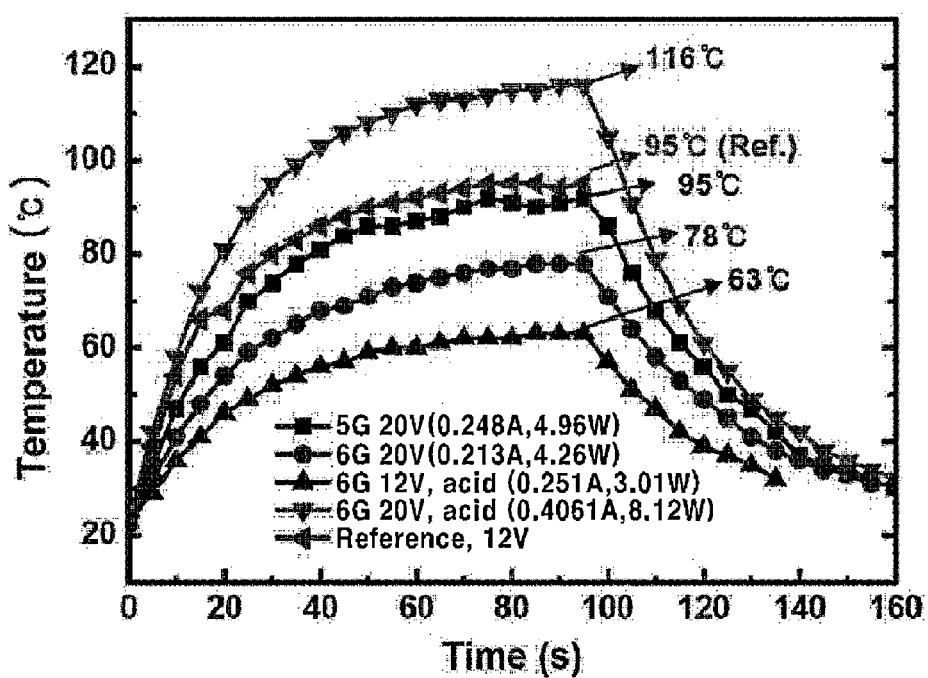
FIG. 16 provides a graph showing changes in temperature over time of flexible transparent heating elements using doped five-layer graphene and doped six-layer graphene in accordance with an example of the present invention.

FIG. 16 provides a graph showing changes in temperature over time of flexible transparent heating elements using chemically doped five-layer graphene and six-layer graphene in accordance with an example of the present invention. A temperature of the doped five-layer flexible transparent heating element was increased more rapidly than that of a five-layer flexible transparent heating element. The highest temperature of the doped five-layer flexible transparent heating element was higher by about 22% or more. It was checked that the highest temperature on a surface of graphene was about 116° C. Further, after power was removed, a time for completely radiating heat was checked. As a result thereof, all the above-described flexible transparent heating elements reached about 30° C. within about 1 minute, and, thus, it could be seen that a doped flexible transparent heating element had a higher heat radiation characteristic.

Figure 17:
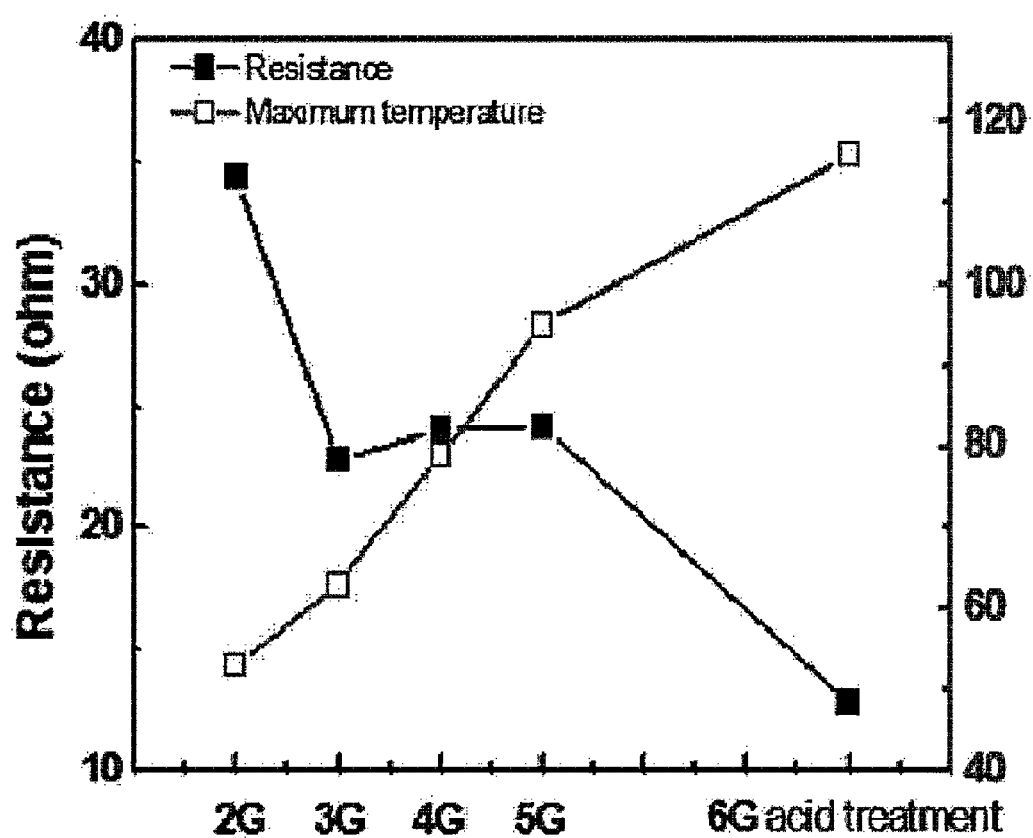
FIG. 17 provides a graph showing changes in resistance and temperature of a flexible transparent heating element using graphene having a different number of layers in accordance with an example of the present invention.
Figure 18:
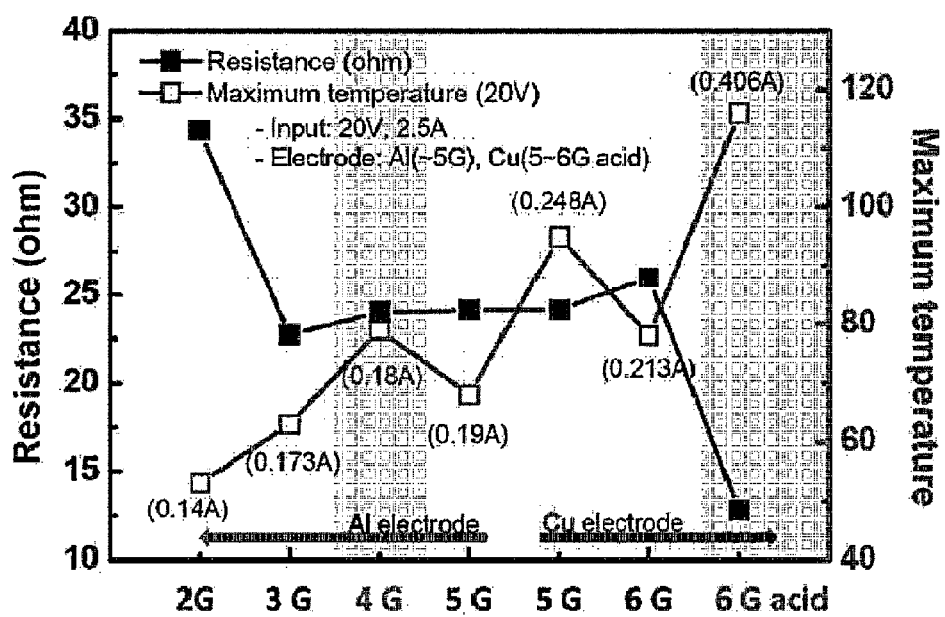
FIG. 18 provides a graph showing changes in resistance and temperature of a flexible transparent heating element using graphene having a different number of layers in accordance with another example of the present invention.

In accordance with another method for increasing heat efficiency of the flexible transparent heating element, a surface resistance was reduced by changing the number of graphene layers formed on a flexible transparent substrate and heat generation efficiency of the heating element was increased. In an example of the present invention, referring to FIG. 17, it could be seen that a surface resistance and a maximum temperature of a flexible transparent heating element were changed depending on the number of deposited graphene layers. An experiment was carried out under the same experimental conditions including a voltage of about 20 V and a current of about 2.5 A. While graphene of three layers was transferred, a surface resistance depending on the number of deposited graphene layers was decreased to about 22 ohm but was not much changed until graphene of five layers were transferred. However, as the number of deposited graphene layers was increased, a maximum temperature on a graphene surface was increased. Further, when six-layer graphene was doped with $HNO_3$, a surface resistance was decreased by about 50% or more, and, thus, a maximum temperature could be increased further (see FIG. 17). FIG. 18 provides a graph showing changes in surface resistance and maximum temperature of a flexible transparent heating element using Al and Cu electrodes 120 and depending on the number of deposited graphene layers in accordance with an example of the present invention. It was observed that the changes in surface resistance and maximum temperature were similar to those of FIG. 17.

Figure 19:
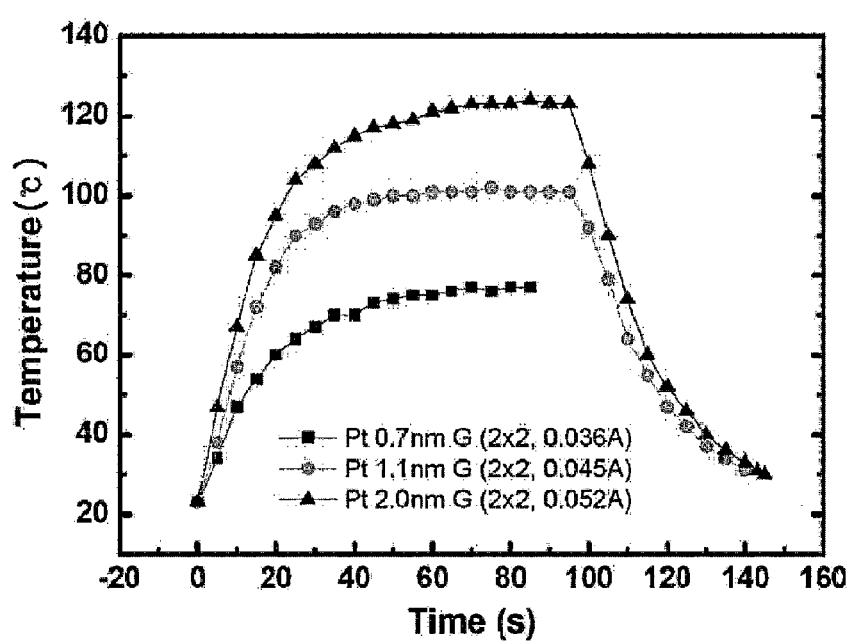
FIG. 19 provides a graph showing changes in temperature over time of a flexible transparent heating element with a metallic layer having a different thickness in accordance with an example of the present invention.

In case of a flexible transparent heating element in which a graphene layer is formed on a metallic layer, heat generation efficiency of the flexible transparent heating element can be increased by adjusting a thickness of the metallic layer. FIG. 19 provides a graph showing changes in temperature over time of a flexible transparent heating element including a layered structure of flexible transparent substrate-metallic layer-graphene layer in accordance with an example of the present invention. PET layers were respectively coated with Pt metallic layers having different thicknesses and graphene layers having the same number of layers were formed on the Pt metallic layer. The thicknesses of the metallic layers were about 0.7 nm, about 1.1 nm, and about 2.0 nm, respectively. Referring to FIG. 19, it could be seen that as a thickness of the Pt metallic layer was increased, a temperature was increased. In the all examples, the flexible transparent heating element reached a maximum temperature within 1 minute. In comparison between the Pt metallic layer of about 1.1 nm and the Pt metallic layer of about 2.0 nm, it could be seen that a maximum temperature was increased by about 20%. In order to check a heat radiation characteristic, after an application voltage was removed, a change in temperature was measured. As a result thereof, it could be seen that a flexible transparent heating element coated with Pt of about 2.0 nm had a maximum temperature higher by about 20° C. but radiated heat more actively as compared with a flexible transparent heating element coated with Pt of about 1.1 nm, and, thus, they returned to a normal temperature within the same time. Therefore, it could be seen that even if a flexible transparent heating element was manufactured with the same graphene, its maximum temperature was increased as a thickness of a metallic layer, such as a Pt layer, was increased.

Figure 20:
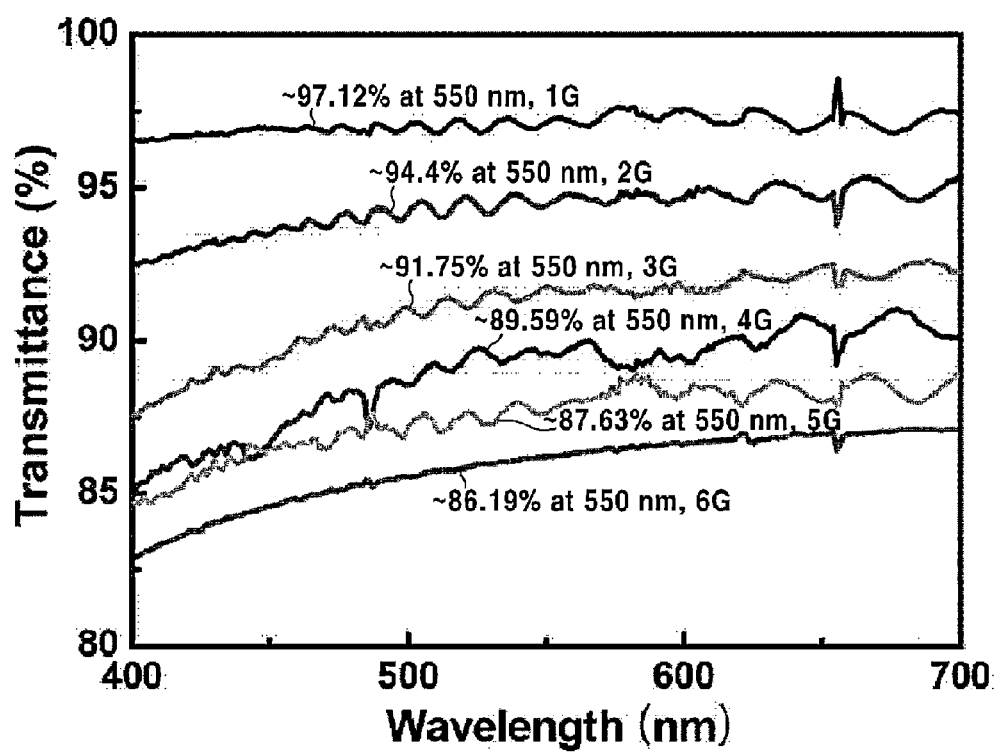
FIG. 20 provides a graph obtained by observing changes in transmittance when varying the number of graphene layers in accordance with an example of the present invention.
Figure 21:
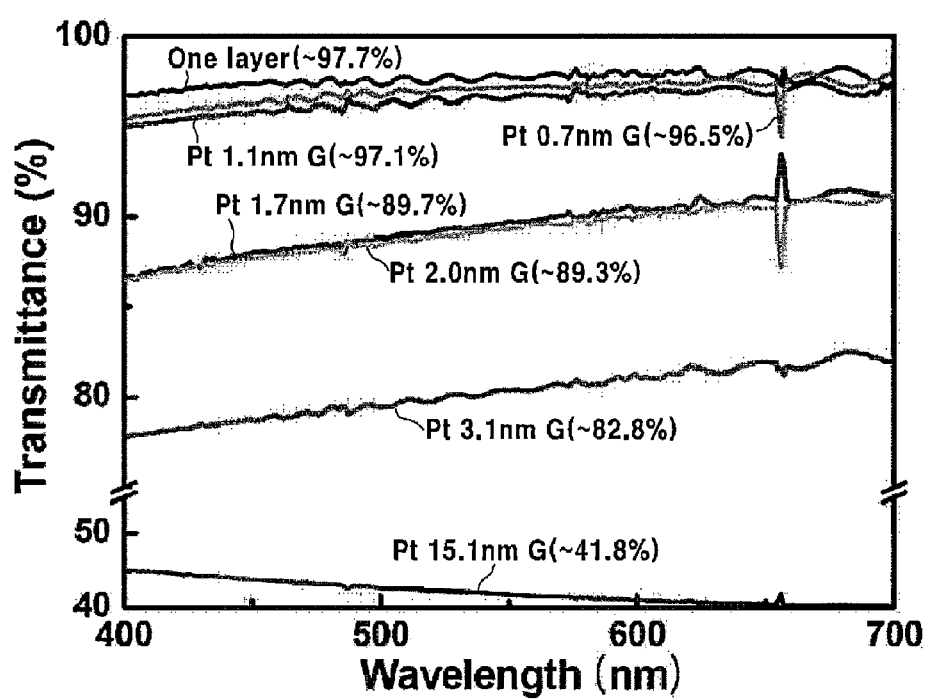
FIG. 21 provides a graph obtained by observing changes in transmittance when varying a thickness of a metallic layer in accordance with an example of the present invention.

As described above, if the number of graphene layers or a thickness of a metallic layer is adjusted in order to improve heat generation efficiency of a flexible transparent heating element, a transmittance of the flexible transparent heating element is changed depending on the number of graphene layers and/or the thickness of the metallic layer. FIG. 20 provides a graph showing changes in transmittance depending on the number of graphene layers deposited on a flexible transparent substrate (PET) in accordance with various examples of the present invention. FIG. 21 provides a graph showing changes in transmittance of graphene used with metallic layers having different thicknesses in accordance with various examples of the present invention. In theory, if graphene of one layer is transferred on a transparent substrate, a transmittance is decreased by about 2.3%. Referring to FIG. 20, although a transmittance was not exactly decreased at a ratio of 2.3%, it could be seen that a transmittance was decreased gradually as the number of deposited graphene layers was increased. It is determined that the reason why the transmittance was decreased by more than 2.3% was that the flexible transparent heating element was partially coated with graphene of one or more layers. Further, it is determined that the reason why the transmittance was decreased by less than 2.3% was that while synthesized graphene was transferred onto the PET layer, cracks appeared in a surface. Finally, it was observed that when six-layer graphene was transferred, the flexible transparent heating element had a transmittance of about 86.2% at a wavelength of about 550 nm. FIG. 21 shows changes in transmittance of graphene used with the metallic layers 130 having different thicknesses and, as a comparative example, changes in transmittance of flexible transparent substrates on which the metallic layers 130 having different thicknesses were deposited respectively.

As stated above, the flexible transparent heating element using graphene in accordance with the present invention is manufactured to have a large area and a plane structure, and, thus, it can be applied to a glass plate used in a car, a ship, an airplane, and the like, a road/traffic sign in mountain areas, a mirror for providing a viewing angle, a screen of military equipment, ski goggles, a glass wall used in a building, and indoor glass in various fields. Further, the flexible transparent heating element using graphene can prevent frost from appearing on glass in winter.

The illustrative embodiments and examples have been provided for illustration of the present invention, but the present invention is not limited thereto. It is clear to those skilled in the art that the illustrative embodiments and examples can be changed and modified in various ways within the scope of the inventive concept as defined by the following claims.

What is claimed is:

1. A flexible transparent heating element using graphene, comprising:
   a flexible transparent substrate;
   a graphene layer formed to at least one side of the flexible transparent substrate; and
   an electrode connected with the graphene layer.

2. The flexible transparent heating element using grapheme of claim 1, wherein the graphene layer generates heat when electrical power is supplied through the electrode.

3. The flexible transparent heating element using grapheme of claim 1 further including:
   a metallic layer between the flexible transparent substrate and the graphene layer.

4. The flexible transparent heating element using grapheme of claim 1, wherein the electrode is formed to a terminal of the graphene layer, the top of the grapheme layer, or the bottom of the graphene layer.

5. The flexible transparent heating element using grapheme of claim 1, wherein the electrode is at least one pair.

6. The flexible transparent heating element using grapheme of claim 1, wherein the electrode is a transparent electrode.

7. The flexible transparent heating element using grapheme of claim 1, wherein the electrode is a patterned microstructure.

8. The flexible transparent heating element using grapheme of claim 1, wherein the graphene layer includes a monolayered or multilayered graphene.

9. The flexible transparent heating element using grapheme of claim 1, wherein the graphene layer is doped by using a dopant.

10. The flexible transparent heating element using grapheme of claim 1 further including:
    a protective layer formed to the electrode and the graphene layer.

11. The flexible transparent heating element using grapheme of claim 10, wherein the protective layer is made of a flexible transparent material.

12. A flexible transparent heating element system using graphene formed by serially connecting or parallel connecting plural flexible transparent heating elements using graphene of claim 1.

13. A method for manufacturing a flexible transparent heating element using graphene, comprising:
    forming a graphene layer to at least one side of a flexible transparent substrate; and
    forming at least one pair of an electrode connected with the graphene layer.

14. The method for manufacturing a flexible transparent heating element using graphene of claim 13 further including:
    forming a protective layer to the electrode and the graphene layer.

15. The method for manufacturing a flexible transparent heating element using graphene of claim 13, wherein the electrode is a patterned microstructure.

16. The method for manufacturing a flexible transparent heating element using graphene of claim 13, wherein the graphene layer is formed by transferring a graphene layer, which is prepared by supplying a reaction gas containing a carbon source and heat on a metallic catalyst for reaction, to at least one side of the flexible transparent substrate.

17. The method for manufacturing a flexible transparent heating element using graphene of claim 13 further including:
    forming a metallic layer to the flexible transparent substrate before or after the graphene layer is formed to the flexible transparent substrate.

18. The method for manufacturing a flexible transparent heating element using graphene of claim 13, wherein the electrode is formed to a terminal of the graphene layer, the top of the graphene layer, or the bottom of the graphene layer.

19. The method for manufacturing a flexible transparent heating element using graphene of claim 13, wherein the graphene layer includes a monolayered or multilayered graphene.

20. The method for manufacturing a flexible transparent heating element using graphene of claim 13, wherein the electrode is a transparent electrode.

21. The flexible transparent heating element using graphene of claim 1, wherein The graphene layer is two-dimensional or planar.

22. The method for manufacturing a flexible transparent heating element using graphene of claim 13, wherein the graphene layer is two-dimensional or planar.

* * * * *